(12) United States Patent
Teranishi et al.

(10) Patent No.: US 8,409,657 B2
(45) Date of Patent: Apr. 2, 2013

(54) PROCESS FOR PRODUCING THICK-FILM TAPE-SHAPED RE-TYPE (123) SUPERCONDUCTOR

(75) Inventors: Ryo Teranishi, Tokyo (JP); Yuji Aoki, Tokyo (JP); Junko Matsuda, Tokyo (JP); Koichi Nakaoka, Tokyo (JP); Teruo Izumi, Tokyo (JP); Yuh Shiohara, Tokyo (JP)

(73) Assignees: The Jurical Foundation, Tokyo (JP); SWCC Showa Cable Systems Co., Ltd., Tokyo (JP)

( * ) Notice: Subject to any disclaimer, the term of this patent is extended or adjusted under 35 U.S.C. 154(b) by 943 days.

(21) Appl. No.: 12/086,294

(22) PCT Filed: Dec. 7, 2006

(86) PCT No.: PCT/JP2006/324441
§ 371 (c)(1),
(2), (4) Date: Jun. 10, 2008

(87) PCT Pub. No.: WO2007/069524
PCT Pub. Date: Jun. 21, 2007

(65) Prior Publication Data
US 2009/0286686 A1 Nov. 19, 2009

(30) Foreign Application Priority Data
Dec. 14, 2005 (JP) ................. 2005-360788

(51) Int. Cl.
*B05D 5/12* (2006.01)
*H01L 39/24* (2006.01)

(52) U.S. Cl. ............ 427/62; 505/434; 505/470
(58) Field of Classification Search ............ 427/62; 505/434, 470
See application file for complete search history.

(56) References Cited

U.S. PATENT DOCUMENTS
7,205,256 B2 * 4/2007 Kijima et al. ............ 502/232
2003/0130129 A1 * 7/2003 Seleznev et al. ............ 505/230

FOREIGN PATENT DOCUMENTS
| JP | 2003-034527 | 2/2003 |
| JP | 2003-257259 | 9/2003 |
| JP | 2003-300726 | 10/2003 |
| JP | 2003-327496 | 11/2003 |

* cited by examiner

*Primary Examiner* — Brian K Talbot
(74) *Attorney, Agent, or Firm* — Bacon & Thomas, PLLC (57) ABSTRACT

A production process of a thick-film tape-shaped RE-type (123) superconductor having a high critical current value. The production process has the steps of providing a composite substrate having $Gd_2Zr_2O_7$ and $CeO_2$ stacked in that order onto a Hastelloy substrate, coating a raw material solution prepared by dissolving a trifluoroacetate of Y and Ba and a naphthenate of Cu onto the composite substrate, heat treating the coated composite substrate by calcination, then subjecting the calcined assembly to intermediate heat-treatment at a temperature below the temperature of heat-treatment for superconductor production, and then heat treating the assembly in an argon gas atmosphere under conditions of highest heating temperature 760° C., water vapor partial pressure 13.5%, and oxygen partial pressure 0.09% for superconductor production to produce a tape-shaped RE-type (123) superconductor having a YBCO superconducting film having a thickness of more than about 2 μm.

8 Claims, 11 Drawing Sheets

PROCESS FOR PRODUCING THICK-FILM TAPE-SHAPED RE-TYPE (123) SUPERCONDUCTOR

TECHNICAL FIELD

This invention relates to a process for producing an oxide superconductor. In particular, this invention relates to the process for producing thick-film tape-shaped RE-type (123) superconductor which is useful to a superconducting magnet, a superconducting electric power cable, an electric power device, etc.

BACKGROUND ART

About the oxide superconductor, because that critical temperature (Tc) exceeds the liquid nitrogen temperature, the applications for the superconducting magnet, the superconducting electric power cable and the electric power device, etc. are expected, and the various studies are advanced vigorously.

In order to apply the oxide superconducting wire to the above mentioned field, it is necessary to produce a long wire which has a high critical current density (Jc) and a high critical current value (Ic). On the other hand, in order to obtain a long tape, it is necessary to form the oxide superconductor onto a metallic tape shaped substrate from viewpoint of strength and flexibility. Also, in order to enable use of the oxide superconductor at a practical level which is equivalent to the metallic superconductor such as $Nb_3Sn$ or $Nb_3Al$, the Ic value of about 500 A/cm (at 77K, in self-field) is required.

Further, in the oxide superconductor, because the oxide superconductor changes the superconducting characteristic by their crystal orientation, it is necessary to improve the in-plane orientation. Also for this reason, it is necessary to form the oxide superconducting layer onto the tape-shaped substrate. In this case, in order to improve the critical current density, it is necessary that the c-axis of the crystal axis for the oxide superconductor is oriented perpendicularly to the plane of the substrate and that its a-axis (or b-axis) has in-plane orientation in parallel to the plane of the substrate, and it is necessary to maintain the quantum connectivity of the superconducting state well.

As the process for producing the tape-shaped RE-type oxide superconductor, that is, as the process for producing $RE_{1+x}Ba_{2-x}Cu_3O_y$ type oxide superconductor (here, RE means at least more than one kind of element selected from Y, Nd, Sm, Gd, Eu, Tb, Pr or Ho. Hereinafter called RE-type (123) superconductor), MOD process (Metal Organic Deposition Processes) is known.

This MOD process makes metal organic acid salt decompose thermally. And after coating a solution that organic compound of metallic component solves uniformly, by heating this and then by making this decompose, the thin film is formed onto the substrate. This MOD process is non-vacuum process. Therefore, because the crystal growth of the film is possible at low cost and high speed, there is an advantage that this process is suitable to produce the long tape-shaped oxide superconductor.

In MOD process, when the metal organic acid salt as starting material is decomposed thermally, the carbonate of alkali earth metal (Ba, etc.) is usually formed. However, in the forming of the oxide superconductor by a solid-phase reaction through this carbonate, the high temperature heat-treatment more than 800 degrees C. is required. In addition, when the thick film is formed, because the nucleation for crystal growth occurs from parts except the interface of the substrate, it is difficult to control the crystal growth rate. Consequently, it is difficult to obtain the superconducting film which has superior in-plane orientation.

In MOD process, as the process for producing RE-type (123) superconductor without going through the carbonate, by using organic acid salt containing fluorine (for example, TFA salt: trifluoroacetate) as the starting material, the process for obtaining the superconductor through decomposition of fluoride by heat-treatment in a water vapor atmosphere is conducted vigorously. In MOD process which uses this TFA salt as the starting material, the superconductor is made by reaction between amorphous precursor containing fluorine which is obtained after calcination of the coating film and water vapor. And, because it is possible to control the decomposition rate of the fluoride by vapor partial pressure in heat-treatment, the crystal growth rate of the superconducting film can be controlled. Consequently, it is possible to make the superconducting film having superior in-plane orientation. Further, in this process, it is possible to make the RE-type (123) superconductor grow epitaxially from the substrate surface at comparatively low temperature.

As discussed previously, when the tape-shaped oxide superconductor is produced by MOD process, thickening the film to improve the Ic value is essential for practical application. For accomplishing the forming of the thick film by MOD process when the starting material is TFA salt, there are thoughts of increasing the viscosity of the material solution containing TEA salt and of thickening the coating film. However, when the thickness of the coating film per once becomes thick, because gas yield of HF and $CO_2$ by decomposition in heat-treatment increases, the phenomenon that the coating film is scattered in calcination occurs. Consequently, it is difficult to produce the thick film of the tape-shaped oxide superconductor having high characteristic.

For producing the thick film of the superconductor, it is possible to thicken the calcination film by repeating the coating of the material and the calcination. However, in the above-mentioned heat-treatment method for calcination of conventional technology, because the temperature-increasing rate which affects the decomposition rate of the metal organic acid salt in the heat-treatment for calcination is fast, the decomposition of the metal organic acid salt including TFA salt is insufficient. Consequently, there is a tendency that the solvent or the organic chain remains in the film of the oxide superconductor precursor which is obtained by the calcination. Therefore, by the increased temperature of the subsequent heat-treatment for crystallization, the organic chains of the remaining fluoride and so on decompose rapidly, and therefore cracks or pores are generated in the film.

This tendency becomes remarkable when the film of the oxide superconductor precursor of multilayer structure is formed and when thickening the film by repeating the coating and the heat-treatment for calcination. Consequently, the epitaxial growth is difficult when the superconducting film is formed by crystallizing the obtained thick film of the precursor. And it is difficult to obtain the superconducting film having superior in-plane orientation, and the Jc characteristic reaches the limit. In addition, the Jc characteristic deteriorates remarkably by generation of the cracks.

For solving these problems, by controlling the temperature-increasing rate in the heat-treatment for calcination, and then by making the metal organic acid salt decompose sufficiently, the method to accomplish the thick film with high Jc is known (for example, refer to Patent document No. 1).

Besides, by controlling the heat-treatment temperature for calcination at the time of the heat-treatment of the oxide superconductor precursor formed onto the substrate, and/or, by controlling the vapor partial pressure of introduced gas in the atmosphere of the heat-treatment for crystallization, the process for producing thick-film tape-shaped oxide superconductor having high orientation and high Jc is known (for example, refer to Patent document No. 2).

Patent document No. 1: Japanese Patent Publication No. 2003-300726
Patent document No. 2: Japanese Patent Publication No. 2003-34527

DISCLOSURE OF THE INVENTION

Problem to be Solved by the Invention

However, in the above-mentioned process which controls the temperature-increasing rate in the heat-treatment for calcination, or, in the above-mentioned process which controls the heat-treatment temperature for calcination, and/or, in the above-mentioned process which controls the vapor partial pressure of introduced gas in the atmosphere of the heat-treatment for crystallization, although thickening the film was achieved than before, the film thickness was limited to approximately 1.0 µm. And cracks occurred when the film thickness reached approximately 2 µm even in the improved process of the heat-treatment for crystallization. Therefore, there was a limit for thickening the film beyond 2 µm.

This invention was conducted to solve the problem of the crack which occurs when making the essential thick-film to obtain the high Ic value. This invention aims to provide the process for producing thick-film tape-shaped RE-type (123) superconductor which has the high Ic value by crystallizing the calcination thick-film and preventing the occurrence of the crack in the heat-treatment for producing the superconductor.

Means for Solving the Problems

When making the thick-film was attempted by conventional process, a cause of the occurrence of the cracks in the film was investigated. The features of the MOD process using TFA salt as the starting material are that the superconductor is produced by reaction between the precursor including fluorine and the water vapor in the heat-treatment for crystallization and that the crystal growth rate can be controlled by the vapor partial pressure. The cracks which occur when the film of ceramics crystallizes tend to be affected by crystal growth rate. Therefore, firstly, the relation between the vapor partial pressure in the crystallization and the crystal growth rate of $YBa_2Cu_3O_{7-y}$ (hereinafter YBCO) crystal was investigated.
(A Relation Between the Water Vapor Molar Fraction $X_{H2O}$ and the Growth Rate of YBCO Crystal)

$LaAlO_3$ (100) single-crystal substrate (hereinafter LAO) was used as the substrate, and the raw material solution which dissolved the trifluoroacetate of each metal in methanol by the molar ratio of Y:Ba:Cu=1:2:3 was coated onto this substrate. After the calcination heat-treatment was given by the heating process at maximum heating temperature 400 degrees C. and by the cooling process, the heat-treatment for the crystallization was given in argon atmosphere (gas mass flow was 1 l/min, in atmospheric pressure) of the maximum heating temperature of 775 degrees C. at the temperature gradient of 25 degrees C./min and of the oxygen partial pressure of 0.1%. And YBCO superconducting film of 0.3 µm was formed.

Figure 1:
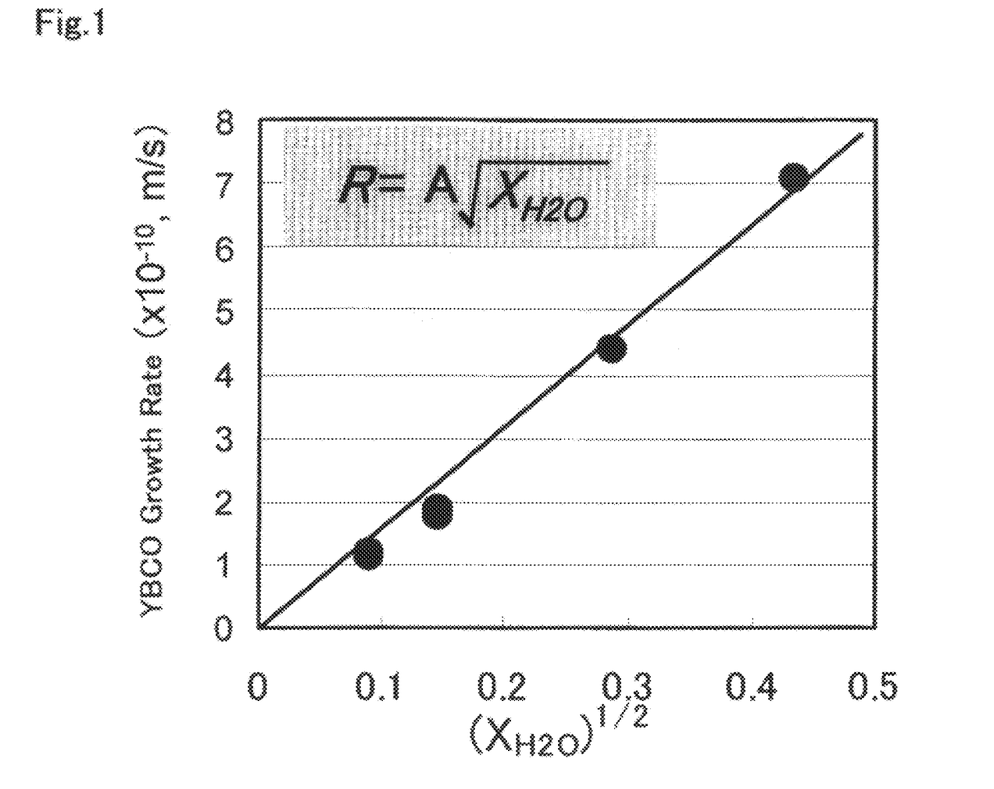
[FIG. 1] The drawing which shows the relation between the water vapor molar fraction $X_{H2O}$ and the growth rate of YBCO crystal.

The relation between the vapor partial pressure and the growth rate of YBCO superconducting phase at this time is shown in FIG. 1. Here, $X_{H2O}$ expresses the vapor partial pressure $P_{H2O}$ by the molar fraction, and for example, $P_{H2O}$13.5% corresponds to $X_{H2O}$=135. Consequently, it became clear that the growth rate of YBCO superconducting phase increased with the rise of the vapor partial pressure. By the way, on any films which were obtained under this condition, the crack occurrence was not confirmed.

Based on this result, next, the relation between the vapor partial pressure at the time of crystallization and the Jc characteristic of the superconducting film which was obtained was investigated.
(A Relation Between the Vapor Partial Pressure $P_{H2O}$ and Jc Value)

A composite substrate that $Gd_2Zr_2O_7$ and $CeO_2$ are formed in sequence onto hastelloy was used as the substrate, and the raw material solution which dissolved the trifluoroacetate of Y and Ba and the naphthenate of Cu by the molar ratio of Y:Ba:Cu=1:2:3 in 2-octanone was coated onto this substrate. After the calcination heat-treatment was given by the heating process at maximum heating temperature 400 degrees C. and by the cooling process, the heat-treatment for the crystallization was given in argon atmosphere (gas mass flow was 1 l/min, in atmospheric pressure) by the maximum heating temperature of 760 degrees C. at temperature gradient of 25 degrees C./min and by the oxygen partial pressure of 0.1%. And YBCO superconducting film of 1.2 µm was formed.

Figure 2:
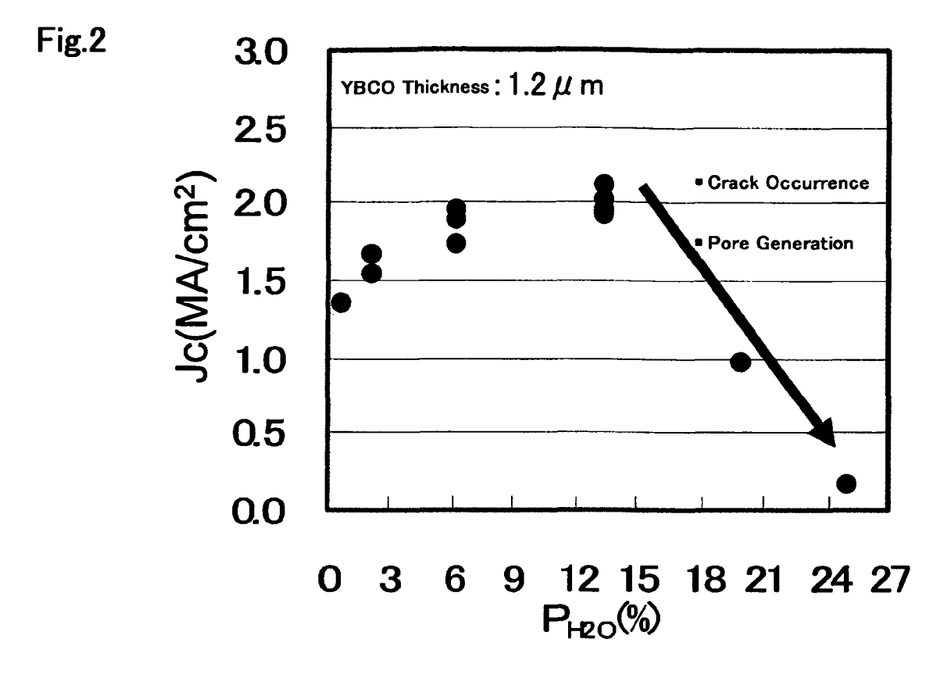
[FIG. 2] The drawing which shows the relation between the vapor partial pressure $P_{H2O}$ and the Jc value.

The relation between the vapor partial pressure and the Jc value of YBCO superconducting film at this time is shown in FIG. 2. As is clear from this result, under condition of this crystallization, although the Jc value of YBCO superconducting film increases to $P_{H2O}$=13.5% with the rise of the vapor partial pressure, when exceeding this value, the Jc value decreases rapidly by the occurrence of the crack or the formation of the pore in YBCO superconducting film.

From the result of the above-mentioned FIG. 1 and FIG. 2, it is preferable that the growth rate of YBCO superconducting phase is large (the vapor partial pressure is large) from the viewpoint of the production speed. However, there is a limit in the increase of the growth rate of YBCO superconducting phase from the viewpoint of the superconducting characteristic, and it was understood that this tendency became large with the increase of YBCO superconducting film.

Figure 3:
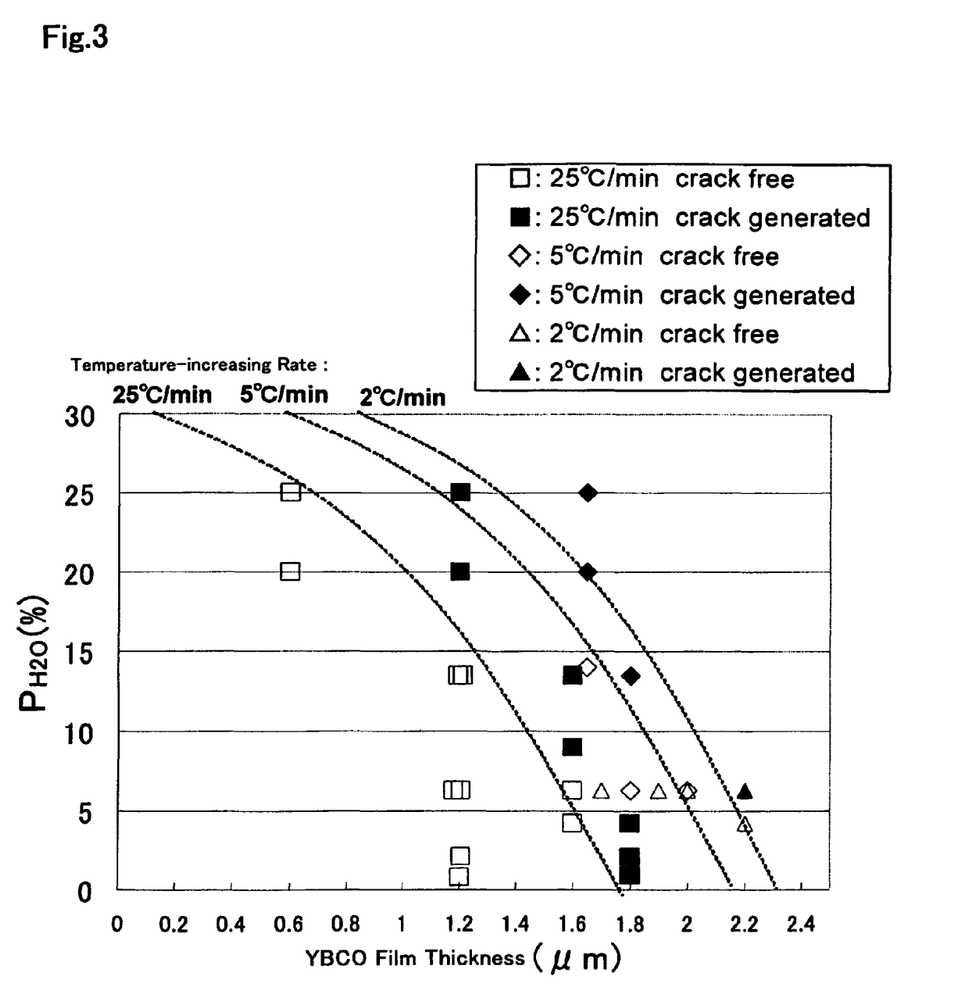
[FIG. 3] The drawing which shows the relation between the crack occurrence and the vapor partial pressure in each film thickness of YBCO superconducting film produced by the conventional process.

Consequently, from the purpose to investigate the proper heat-treatment conditions without the occurrence of the cracks to thicken the film and to heighten the Ic in future, for the film thickness of each YBCO films, the critical vapor partial pressure without the occurrence of the cracks was investigated. The relation between the vapor partial pressure and the occurrence of the cracks in the film thickness of each YBCO films is shown in FIG. 3. Consequently, the critical vapor partial pressure showed the dependence property between the film thickness of YBCO and the temperature-increasing rate at the time of crystallization. And the critical vapor partial pressure became low as the film thickness of YBCO increased, and it was understood that the thick film was able to be baked only under the vapor partial pressure of the field where the growth rate was slow from the viewpoint of speed-up.

Figure 4:
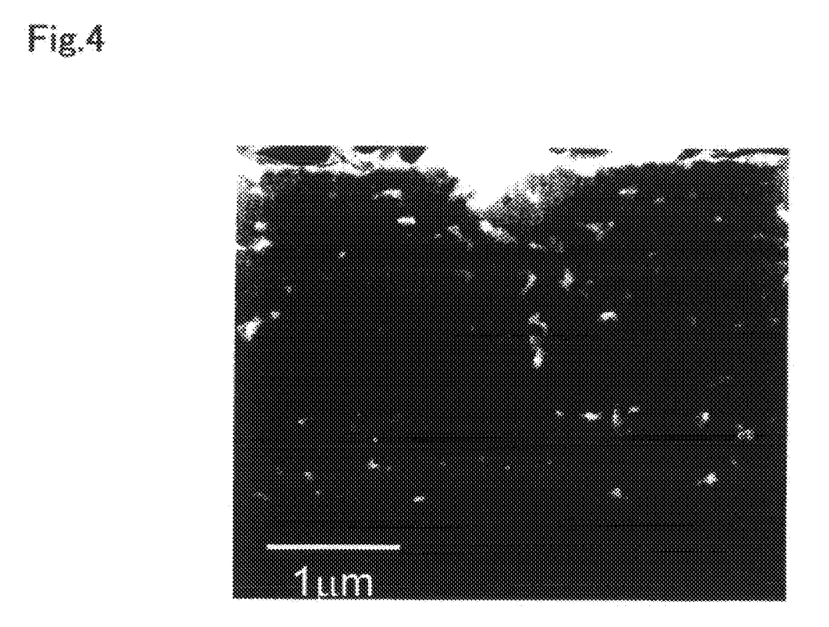
[FIG. 4] The drawing which shows the organization of the cross section of the film at the time of reaching the crystallization temperature in the heat-treatment by the conventional process.

Next, concerning YBCO film whose film thickness is 2.2 µm, an organization observation of the film at the time of crystallization were performed to investigate a cause of the occurrence of the crack. The heat-treatment was started, and a specimen was brought out from a furnace when the furnace temperature reached a crystallization temperature, and an organization of a cross section of the film was observed just before the crystal growth of YBCO begins. From the result of the observation by an electron microscope shown in FIG. 4, it was understood that the organization was getting rough and that a lot of fluoride existed due to big and many pores which were formed after rapid decomposition and desorption of the organic component at the time of temperature-increasing in the heat-treatment. It is thought that this organization which has many pores and gets rough causes the occurrence of the crack by becoming a starting point of a local stress-strain at the time of deposition and shrinkage of the film involving YBCO phase generation after that.

From the above mentioned result, it is essential that the heat-treatment condition without the occurrence of the crack in the thick film is found for the attainment of the purpose of high Ic. Therefore, it became clear that it was necessary to let the organic component or the fluoride defecate slowly before reaching YBCO formation temperature, and that it was necessary to conduct the transition to the crystallization with smooth quality of the film.

The process for producing thick-film tape-shaped RE-type (123) superconductor by this invention was made based on the above-mentioned knowledge. And in the process for producing the RE-type (123) superconductor by giving the calcination heat-treatment after coating the raw material solution including metal elements which compose the RE-type (123) superconductor onto the substrate, and subsequently by giving the heat-treatment for producing the RE-type (123) superconductor, this invention has a feature that an intermediate heat-treatment is given with the low temperature than the heat-treatment temperature for producing the superconductor between the calcination heat-treatment and the heat-treatment for producing the superconductor. Consequently, it is possible to defecate the residual organic component or the residual fluoride by calcination before reaching the crystallization temperature of YBCO by this intermediate heat-treatment.

Figure 5:
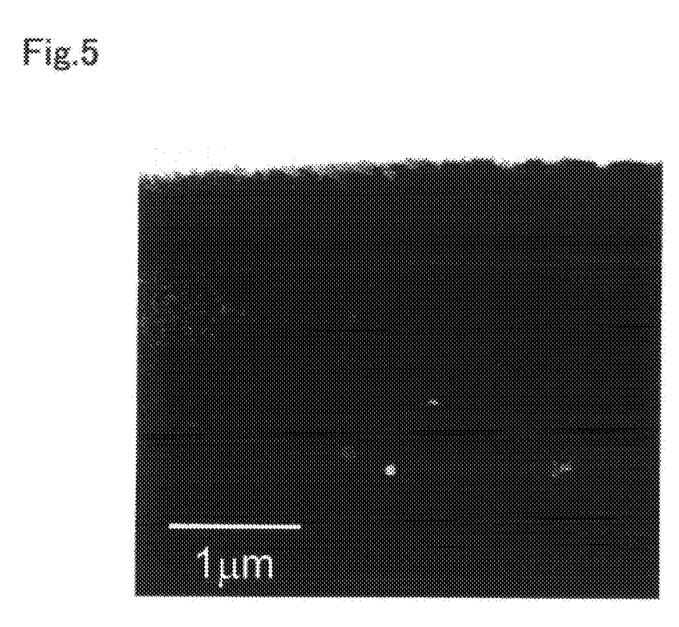
[FIG. 5] The drawing which shows the organization of the cross section of the film at the time of reaching the crystallization temperature in the heat-treatment through the intermediate heat-treatment in the process of this invention.

And, concerning YBCO film whose film thickness is 2.2 μm, the intermediate heat-treatment for 1 hour at 550 degrees C. was given, subsequently, the specimen was brought out from the furnace when the furnace temperature reached the crystallization temperature, and the organization of a cross section of the film was observed just before the crystallization of YBCO generation begins, and an effectiveness of the intermediate heat-treatment was confirmed. From the result of the observation by the electron microscope shown in FIG. 5, it was confirmed that the pores observed in FIG. 4 were reduced remarkably by the intermediate heat-treatment, and that the roughness of the film section decreased and became minute.

Figure 6:
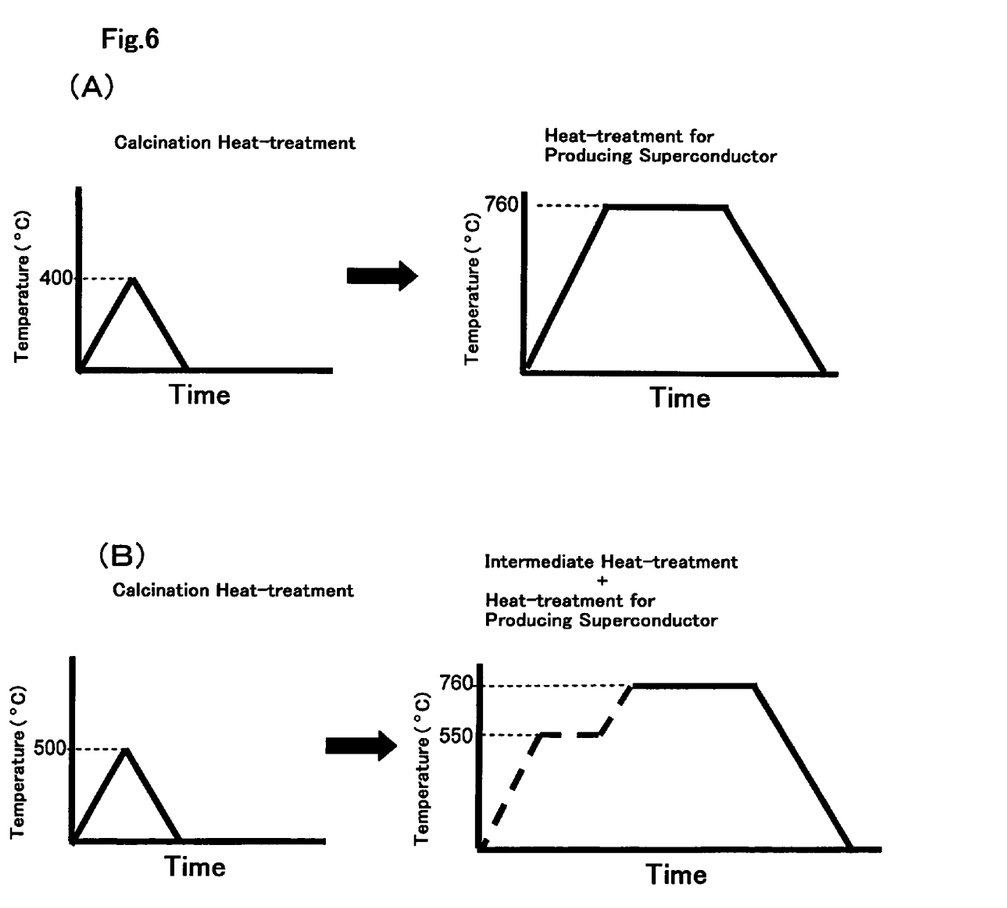
[FIG. 6] The drawing which shows an embodiment of the heat-treatment of the conventional process (A) and the heat-treatment of the process of this invention (B).

Here, the profiles by the intermediate heat-treatment and the conventional heat-treatment are shown in FIG. 6. FIG. 6 (A) shows the profile of the conventional heat-treatment. After the calcination heat-treatment which is constituted by cooling process which follows heating up to approximately 400 degrees C., according to the heat-treatment for producing the superconductor which is constituted by the holding of the constant temperature of the predefined time which follows heating up to approximately 760 degrees C. and by cooling process, the RE-type (123) superconductor is produced.

In this invention, as shown in same figure (B), for example, after the calcination heat-treatment which is constituted by cooling process which follows heating up to approximately 500 degrees C., according to the intermediate heat-treatment which is constituted by the holding of the constant temperature of the predefined time which follows heating up to approximately 550 degrees C., and subsequently, according to the heat-treatment for producing the superconductor which is constituted by sustainment of the constant temperature of the predefined time which follows heating up to approximately 760 degrees C. and by cooling process, the RE-type (123) superconductor is produced. That is, the intermediate heat-treatment is given with the low temperature than the heat-treatment temperature for producing the superconductor between the calcination heat-treatment and the heat-treatment for producing the superconductor.

As described above, it is preferable that the calcination heat-treatment is given with the low temperature than the heat-treatment temperature of the intermediate heat-treatment, and it is preferable that the heat-treatment of the intermediate heat-treatment and the heat-treatment for producing the superconductor are constituted by continuous heating and cooling processes as shown in FIG. 6 (B). In the calcination heat-treatment which is constituted by heating and cooling processes, it is possible that the coating of the raw material solution and the calcination heat-treatment after coating can be also given two or more times. The calcination heat-treatment temperature of two or more times does not need to be the same temperature.

Figure 7:
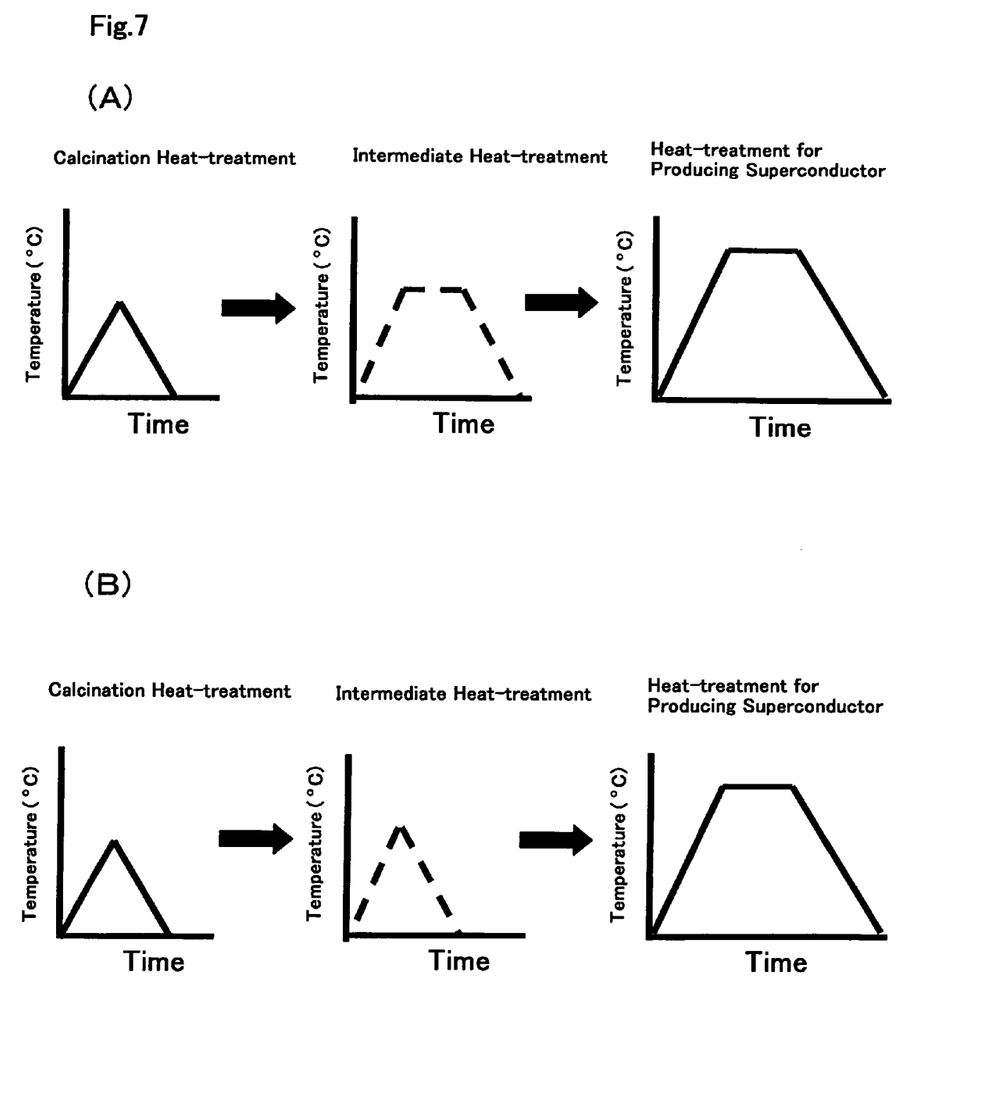
[FIG. 7] The drawing which shows another embodiments (A) and (B) of the heating and cooling processes of the calcination heat-treatment and the intermediate heat-treatment in this invention.

Meanwhile, the calcination heat-treatment and the intermediate heat-treatment in this invention can be also constituted by heating and cooling processes respectively as shown in FIG. 7. FIG. 7 (A) shows the sustainment of predefined time, meanwhile, FIG. 7 (B) shows the composition based on only heating and cooling processes in the intermediate heat-treatment, and each method can be used. In both methods, it is preferable to give the following processes. That is, the calcination heat-treatment and the intermediate heat-treatment are constituted by heating and cooling processes respectively, and the coating of the raw material solution and the calcination heat-treatment after coating are given two or more times, and subsequently, the intermediate heat-treatment is given at least one time. In this case, the intermediate heat-treatment can be given also after coating of the raw material solution.

In addition, the intermediate heat-treatment, and the subsequent heat-treatment for producing the superconductor can be also constituted by continuous heating and cooling processes. The calcination heat-treatment temperature of two or more times does not need to be the same temperature. In the case that the intermediate heat-treatment is given after coating of the raw material solution, the calcination heat-treatment after coating of the raw material solution is substantially included in the intermediate heat-treatment which is constituted by heating and cooling processes.

That is, in the case of producing the RE-type (123) superconductor onto the substrate by TFA-MOD process which uses the mixed solution of the metal organic acid salt including the organic solvent and the fluorine, as the raw material solution, if the thick film is formed by repeating the coating and the calcination according to the conventional process, as before, because the decomposition of the metal organic acid salt becomes insufficient and the cracks or the pores generate in the film by rapid decomposition of the fluoride which remain at the time of the temperature-increasing in the heat-treatment for the crystallization, it becomes necessary to delete the residual fluoride in the thick film certainly by the intermediate heat-treatment of higher temperature. However, because the intermediate heat-treatment temperature is higher than the calcination heat-treatment temperature, and because one heat-treatment time becomes longer than the calcination heat-treatment as compared with the same temperature-increasing rate, total heat-treatment time increases along with making the thick film.

Figure 8:
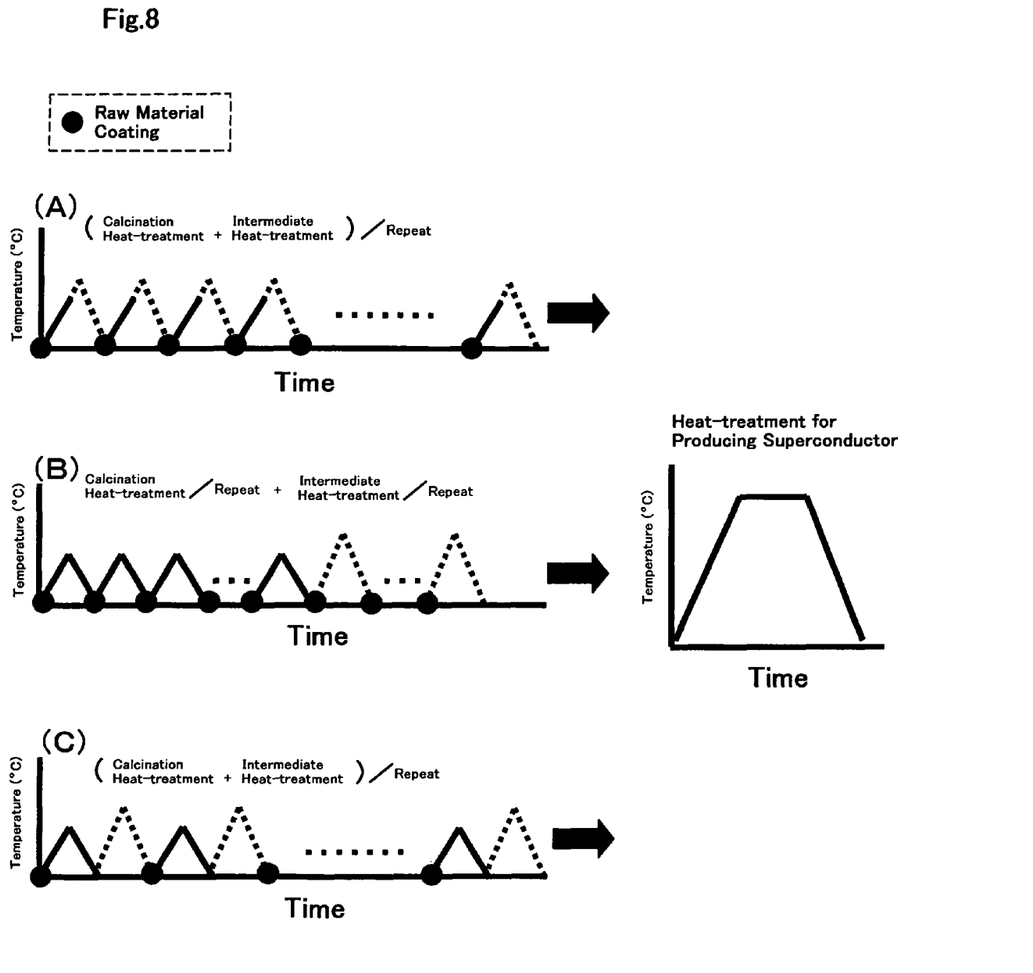
[FIG. 8] The drawing which shows additional other embodiments (A), (B) and (C) of the heating and cooling processes of the calcination heat-treatment and the intermediate heat-treatment in the process of this invention.

For the demand of the high-speed formation of the thick film, this invention can be conducted by the process shown in FIG. 8 (A) or FIG. 8 (B).

In the process of this invention shown in FIG. 8 (A), the calcination heat-treatment and the intermediate heat-treatment are constituted by the continuous heating and cooling processes, and the coating of the raw material solution and these continuous heating and cooling processes are given two or more times, and then the high-speed formation of the thick film is attempted. In this case, the calcination heat-treatment is given in the heating process up to predefined temperature, and the intermediate heat-treatment is given by the heating and cooling processes which follow this. The calcination heat-treatment temperature and the intermediate heat-treatment temperature of two or more times of this case do not need to be the same temperature respectively.

Meanwhile, in the process shown in FIG. 8 (B), the calcination heat-treatment and the intermediate heat-treatment are constituted by the heating process and the cooling process respectively, and the coating of the raw material solution and the calcination heat-treatment after coating are given two or more times, and then, the intermediate heat-treatment which is conducted by coating the raw material solution is given two or more times. In this process, the high-speed formation is conducted by using the conventional calcination process till certain film thickness, and by giving the intermediate heat-treatment after coating of the raw material solution following this. The calcination heat-treatment temperature and the intermediate heat-treatment temperature of two or more times of this case do not need to be the same temperature respectively.

Additionally, concerning the process for producing the thick-film tape-shaped RE-type (123) superconductor of this invention, as shown in FIG. 8(C), in the process for producing the RE-type (123) superconductor onto the substrate by giving the calcination heat-treatment after coating of the raw material solution including metal elements which compose the RE-type (123) superconductor, the calcination heat-treatment which is constituted by the heating and cooling processes, and the intermediate heat-treatment which is constituted by the heating and cooling processes with high temperature than the calcination heat-treatment temperature and with low temperature than the heat-treatment temperature for producing the superconductor are given continuously after coating of the raw material solution. And the calcination heat-treatment and the intermediate heat-treatment after coating of the raw material solution are given two or more times, after that, the heat-treatment for producing the superconductor is given.

Concerning the process for producing the thick-film tape-shaped RE-type (123) superconductor by using TFA-MOD method of this invention, in the process for producing the superconductor onto the biaxially-oriented substrate by giving the calcination heat-treatment after coating of the raw material solution which comprises the metal organic acid salt including fluorine of metal element which constitutes $RE_{1+x}BA_{2-x}Cu_3O_y$ superconductor and the organic solvent, and subsequently, by giving the heat-treatment for producing the superconductor, the intermediate heat-treatment is given at the temperature less than the temperature for producing $RE_{1+x}Ba_{2-x}Cu_3O_y$ superconductor between the calcination heat-treatment and the heat-treatment for producing the superconductor. And the calcination heat-treatment is given at higher temperature than the volatilization of the organic solvent and the decomposition of the metal organic acid salt in mixed solution and at lower temperature than the heat-treatment temperature of the intermediate heat-treatment.

EFFECT OF THE INVENTION

In this invention, by giving the intermediate heat-treatment with low temperature than the heat-treatment temperature for producing the superconductor between the calcination heat-treatment and the heat-treatment for producing the superconductor, it is possible to produce the thick-film tape-shaped RE-type (123) superconductor which has the high Ic value and exceeds 2 μm in the thickness by preventing the occurrence of the crack in the heat-treatment at the time of making the thick film for producing the superconductor.

Besides, by giving the above mentioned intermediate heat-treatment, it is possible to accomplish the high-speed formation of the thick film by raising the vapor partial pressure in the heat-treatment for producing the superconductor.

BEST MODE FOR CARRYING OUT THE INVENTION

As described above, this invention has the main feature that the intermediate heat-treatment is given with the low temperature than the heat-treatment temperature for producing the superconductor between the calcination heat-treatment and the heat-treatment for producing the superconductor.

Besides, it is preferable that the above described intermediate heat-treatment is given at temperature in the range of 350-750 degrees C., and that the calcination heat-treatment is given at low temperature than the heat-treatment temperature of this intermediate heat-treatment. In addition, it is preferable that this intermediate heat-treatment is given in the mixed gas atmosphere which includes water vapor and oxygen in the gas which does not react to the RE-type (123) superconductor. However, it is possible that the intermediate heat-treatment is given also in oxygen, argon or air. In the case of adopting the mixed gas atmosphere, it is preferable that the oxygen partial pressure is 1% or less.

In this invention, the effectiveness is brought out more by adopting TFA-MOD process. As the raw material solution in this case, the mixed solution of the organic solvent and the metal organic acid salt is used. For example, the metal organic acid salt is any one or more kinds of metal salt having carboxyl group, amines metallic salt having amino group, amino acid metallic salt comprising amino group and carboxyl group, nitrate, metallic alkoxide and acetylacetonate. Especially, the mixed solution including any one or more kinds of trifluoroacetate, naphthenate, octylic acid salt, neodecanoic acid salt, isononanoic acid salt is used. In this case, as the raw material solution, it is preferable to use the mixed solution comprising the organic solvent and the metal organic acid salt including the fluorine.

It is preferable that the calcination heat-treatment in TFA-MOD process is given at the temperature more than the volatilized temperature of the organic solvent and the decomposition temperature of the metal organic acid, and at the low temperature than the heat-treatment temperature of the intermediate heat-treatment. Meanwhile, the intermediate heat-treatment is given at the temperature less than the decomposition temperature of $BaF_2$ and at the temperature less than the temperature for producing the RE-type (123) superconductor. By this intermediate heat-treatment, mainly the fluorine other than $BaF_2$ is reduced, and the reaction at the time of heat-treatment for producing the superconductor which follows the intermediate heat-treatment can be attained effectively.

As the substrate which is used in this invention, any of a single-crystalline substrate or a biaxially-oriented polycrystalline substrate can be used.

$LaAlO_3$ (100) single-crystal substrate (LAO single-crystal substrate) as the single-crystal substrate can be used. On the other hand, as the polycrystalline substrate, a biaxially-textured Ni substrate can be used or a composite substrate which uses an IBAD process (Ion Beam Assisted Deposition) can be used.

The biaxially-textured Ni substrate is highly oriented by the heat-treatment of the strongly cold rolling processed Ni substrate in vacuum. It is called RABiTS (Trade Mark: Rolling-Assisted Biaxially Textured-Substrate). A cerium is deposited onto this biaxially-textured Ni substrate by electron beam evaporation at high temperature in inlet gas atmosphere. And a thin film of an epitaxial layer of $CeO_2$ is deposited by existence of the water vapor during this deposition. In addition, onto that film, the thick film of YSZ (yttria-stabilized zirconia) is formed by sputtering method at high temperature in vacuum, and the resulting product can be used as the substrate.

This $CeO_2$ layer and YSZ layer have a function as a buffer layer, and they inhibit the reaction with the superconducting layer and prevent the deterioration of the superconducting characteristics, and they are arranged to maintain the consistency with the superconducting layer. Furthermore, the thin film of $CeO_2$ which is better in crystallographic consistency with $Y_{1+x}Ba_{2-x}Cu_3O_y$ (here in after called YBCO) superconductor is arranged onto the above described YSZ layer, and the resulting product can be used as the substrate.

Besides, in the composite substrate using IBAD process, onto the tape-shaped Ni based substrate (hastelloy etc.) which is nonmagnetic and has high strength, the intermediate layer ($CeO_2$, $Y_2O_3$, YSZ etc.), which has the high orientation and is the layer for inhibiting the reaction with the elements which constitute the superconductor, is formed by irradiating ion from the diagonal direction for this Ni based substrate and by depositing the particles generated from the target. And above described intermediate layer comprising double layer structure (YSZ or $Zr_2R_{x2}O_7/CeO_2$ or $Y_2O_3$ etc.: Rx shows Y, Nd, Sm, Gd, Ei, Yb, Ho, Tm, Dy, Ce, La or Er) is also suitable well (Tokukaihei 4-329867, Tokukaihei 4-331795, Tokugan 2000-333843).

Hereinafter, the embodiments of this invention are explained.

Embodiments

Embodiment 1

As the substrate, the composite substrate that $Gd_2Zr_2O_7$ and $CeO_2$ were formed in sequence onto the hastelloy was used. And the raw material solution which dissolved the trifluoroacetate of Y and Ba and the naphthenate of Cu into 2-octanone with the concentration of 1.2 mol/l as the metal content so that the molar ratio of Y:Ba:Cu becomes 1:2:3 was coated onto this substrate, and the calcination heat-treatment was given in the oxygen gas atmosphere (gas mass flow 1 l/min, in atmospheric pressure) of the maximum heating temperature of 500 degrees C. at the temperature gradient of 2 degrees C./min and of the vapor partial pressure of 2.1%.

Next, the intermediate heat-treatment was given in the atmosphere (gas mass flow 1 l/min, in atmospheric pressure) of the vapor partial pressure of 2.1% and the oxygen partial pressure of 0.09% by heating at the temperature gradient of 5 degrees C./min from room temperature to 550 degrees C. and by maintaining at this temperature for 1-2 hours.

After above mentioned intermediate heat-treatment, the heat-treatment for producing the superconductor was given in the argon gas atmosphere (gas mass flow 1 l/min, in atmospheric pressure) of the maximum heating temperature of 760 degrees C., the vapor partial pressure of 13.5% and the oxygen partial pressure of 0.09% by heating at the temperature gradient of 3 degrees C./min from 550 degrees C.

Figure 9:
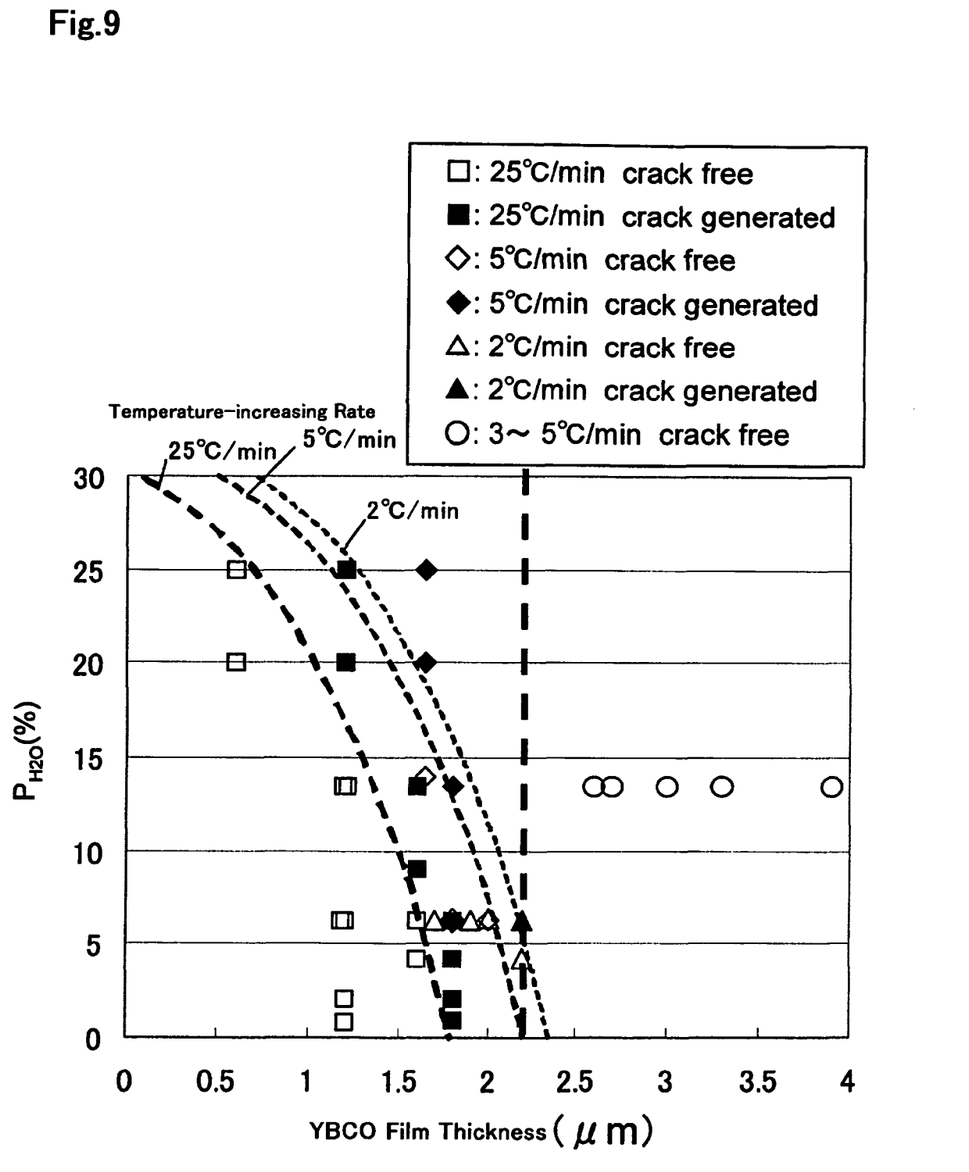
[FIG. 9] The drawing which shows the relation between the crack occurrence and the vapor partial pressure in each film thickness of YBCO superconducting film produced by the process of this invention (white circle) and the conventional process.

The thickness of YBCO superconducting film of the tape-shaped RE-type (123) superconductor which was produced by changing the number of times of the coating in the process shown in FIG. 8 is shown as white circle of FIG. 9. In this figure, the white circles correspond to the case that the occurrence of the cracks is not found.

By above mentioned process of this invention, YBCO superconducting film which is produced by giving the intermediate heat-treatment between the calcination heat-treatment and the heat-treatment for producing the superconductor has no occurrence of the cracks in the range of about 2.5-4 μm at all.

COMPARATIVE EXAMPLE 1

By using the same substrate and raw material solution with embodiment 1, the calcination heat-treatment and the heat-treatment for producing the superconductor were given by processes shown in FIG. 6 (A).

The calcination heat-treatment was given in the oxygen gas atmosphere (gas mass flow 1 l/min, in atmospheric pressure) of the maximum heating temperature of 400 degrees C. and the vapor partial pressure of 2.1% by the temperature gradient of 2 degrees C./min.

Meanwhile, the heat-treatment for producing the superconductor that the temperature gradient was fluctuated in the range of 2-25 degrees C./min was given in argon gas atmosphere (gas mass flow 1 l/min, in atmospheric pressure) of the maximum heating temperature of 760 degrees C., the vapor partial pressure of the range of 1-25% and the oxygen partial pressure of 0.1%.

In FIG. 9 which showed the relation between the thickness of YBCO superconducting film of tape-shaped RE-type (123) superconductor which was produced by changing the number of times of the coating and the vapor partial pressure, where the temperature gradient was shown as a variable factor, the white marks of temperature gradient correspond to the case that the occurrence of the cracks was not found, and the marks filled by black color correspond to the case that the occurrence of the cracks was found.

As is evident from this result, if raising the vapor partial pressure in order to increase the growth rate of YBCO superconducting phase, YBCO superconducting film which was produced without giving the intermediate heat-treatment between the calcination heat-treatment and the heat-treatment for producing the superconductor is obtained only the film thickness of approximately 0.5-1.2 μm. On the other hand, even if lessening the vapor partial pressure in order to attempt to thicken the film thickness, the limit of the film thickness is approximately 2 μm.

[Comparison of Surface Aspect]

Figure 10:
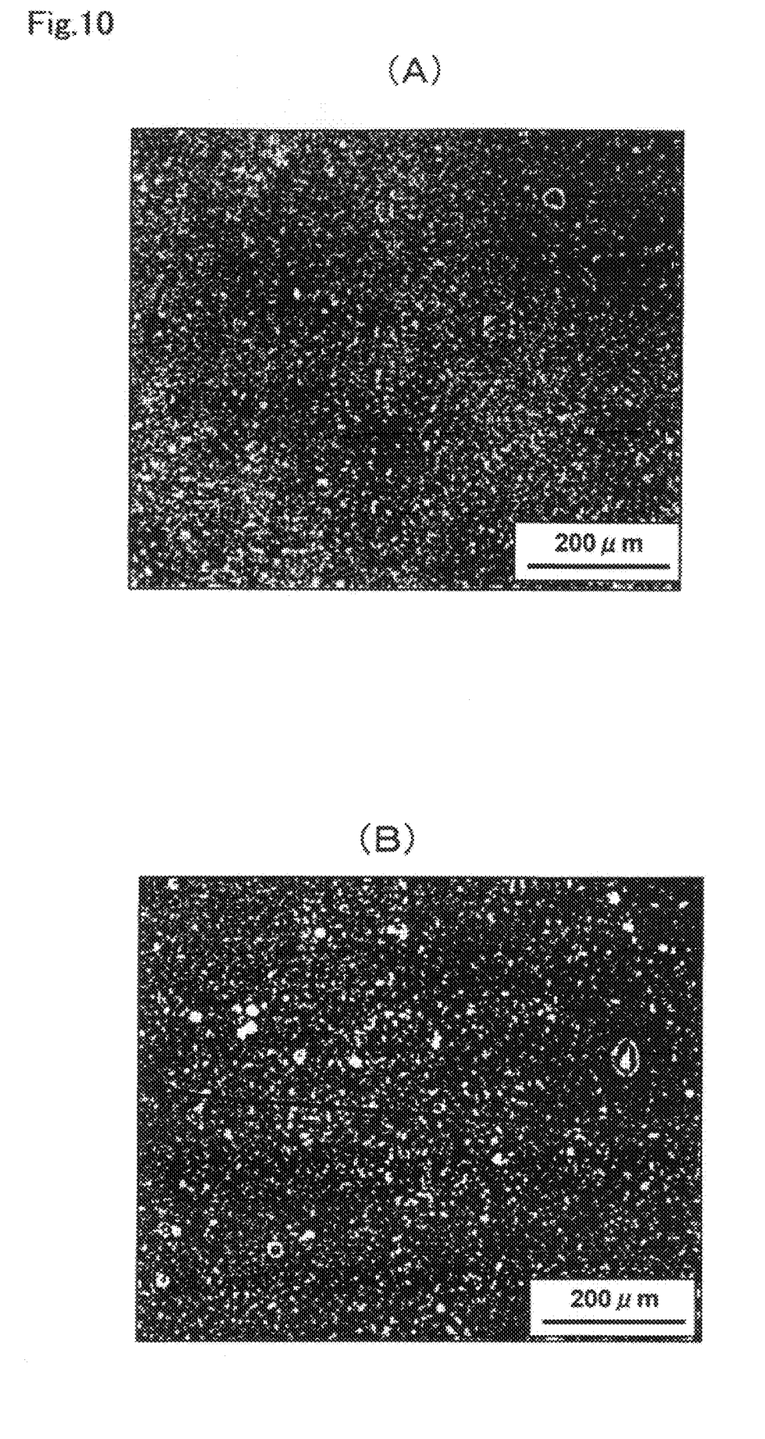
[FIG. 10] The drawing (photograph) which shows the surface aspects of YBCO superconducting film produced by the process of this invention (A) and the conventional process (B).

FIG. 10 (A) shows the surface aspect of YBCO superconducting film by an optical microscope when the thickness of YBCO superconducting film in above mentioned embodiment 1 is 3.9 μm, and this figure (B) shows the surface aspect of YBCO superconducting film by an optical microscope when the thickness of YBCO superconducting film in above mentioned comparative example 1 is 2.2 μm (the heat-treatment for producing the superconductor is the temperature gradient of 2 degrees C./min and the vapor partial pressure of 13.5%). The black lines in this figure (B) are indicated in order to clarify the crack portions.

As it is clear from this drawing, when YBCO superconducting film is formed without giving the intermediate heat-treatment by the vapor partial pressure of 13.5% same as the embodiment 1, the cracks occur and the superconducting characteristic deteriorates remarkably. In addition, from the result of the observation by the electron microscope, about the specimen corresponding to above described comparative example 1, the occurrence of large pores by rapid decomposition and desorption of the fluoride at the time of the temperature rising was found. On the other hand, about the specimen corresponding to the above mentioned embodiment 1, the remaining pores in the film were very few by giving the intermediate heat-treatment. From this result, it was observed clearly that the quality of the film became dense.

Embodiment 2

Ic value (77K, in self-magnetic field) was measured about YBCO superconductor of the tape-shaped RE-type (123) superconductor which was produced by giving the intermediate heat-treatment between the calcination heat-treatment and the heat-treatment for producing the superconductor by the process similar to the embodiment 1. The relation between the thickness of YBCO superconducting film and Ic value is shown in white circle of FIG. 11.

COMPARATIVE EXAMPLE 2

The calcination film was formed onto the substrate by the process similar to the comparative example 1, and YBCO superconducting film was formed onto this calcination film. The heat-treatment for producing the superconductor that the temperature gradient was fluctuated in the range of 2-25 degrees C./min was given in argon gas atmosphere (gas mass flow 1 l/min) of the maximum heating temperature of 760 degrees C., the vapor partial pressure of the range of 6.3-13.5% and the oxygen partial pressure of 0.05-1%.

Figure 11:
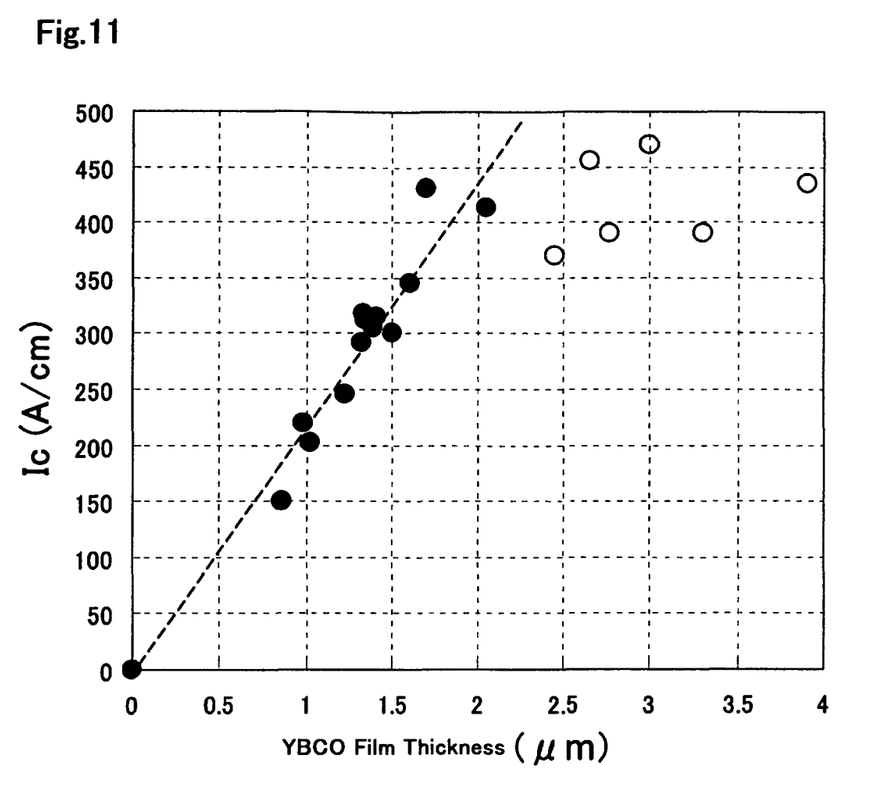
[FIG. 11] The drawing which shows the relation between the thickness of YBCO superconducting film and the Ic value produced by the process of this invention (white circle) and the conventional process.

The relation between the thickness of YBCO superconducting film of tape-shaped RE-type (123) superconductor which was produced by changing the number of times of the coating and Ic value (77K, in self magnetic field) is shown by black circle in FIG. 11.

(Comparison Between Ic Value and the Film Thickness)

As it is clear from the result of the embodiment 2 and the comparative example 2, YBCO superconducting film which was produced by giving the intermediate heat-treatment between the calcination heat-treatment and the heat-treatment for producing the superconductor shows all high values up to maximum Ic value of 470 A/cm in the range of approximately 2.5-4 μm. On the other hand, in the YBCO superconducting film which was produced without giving the intermediate heat-treatment between the calcination heat-treatment and the heat-treatment for producing the superconductor, Ic value increases with the increase of the film thickness. However, because the film thickness has a limit, Ic value stops at approximately 400 to 430 A/cm.

Industrial Applicability

Because it is possible to thicken the film of the superconductor by this invention, the thick-film tape-shaped RE-type (123) superconductor having high Ic value can be produced. And because the superconducting layer is formed by MOD process which is non-vacuum process, it is suitable to the long wire. And the production cost can be decreased remarkably, in addition, it is applicable to superconducting magnet, superconducting cable and power equipment and so on.

The invention claimed is:

1. A process for producing thick-film tape-shaped RE-type (123) superconductor comprising:
    coating of a raw material solution comprising an organic acid salt, including fluorine, of a metal element which composes the RE-type (123) superconductor and an organic solvent onto a biaxially-oriented substrate to produce a coated substrate;
    subjecting the coated substrate to a calcination heat-treatment at a first temperature higher than a volatilization temperature of the organic solvent and a decomposition temperature of the organic acid salt in solution;
    subsequent to said calcination heat-treatment, subjecting the coated substrate to a heat-treatment at a second temperature in a mixed gas atmosphere having a water vapor partial pressure of less than 13.5% for producing the RE-type (123) superconductor;
    subjecting the coated substrate to an intermediate heat-treatment to remove the residual organic acid salt and/or the residual fluoride by calcinations before reaching the crystallization temperature of the superconductor, at a third temperature at a constant temperature for a predetermined time higher than the first temperature and lower than the second temperature, between said calcination heat-treatment and said heat-treatment for producing the superconductor,
    wherein the intermediate heat-treatment is given in the mixed gas atmosphere having an oxygen partial pressure of less than 1% which does not react to the RE-type (123) superconductor, and the third temperature is less than the decomposition temperature of $BaF_2$; and
    producing the thick-film tape-shaped RE-type superconductor having a film thickness of greater than 2.0 μm.

2. The process for producing thick-film tape-shaped RE-type (123) superconductor according to claim 1, wherein the intermediate heat-treatment and the heat-treatment for producing the superconductor are constituted by continuous heating and cooling processes.

3. The process for producing thick-film tape-shaped RE-type (123) superconductor according to claim 1, wherein the calcination heat-treatment and the intermediate heat-treatment are constituted by heating and cooling processes respectively.

4. The process for producing thick-film tape-shaped RE-type (123) superconductor according to claim 1, wherein the calcination heat-treatment and the intermediate heat-treatment are constituted by the continuous heating and cooling processes, and said coating of the raw material solution and said continuous heating and cooling processes are given two or more times.

5. The process for producing thick-film tape-shaped RE-type (123) superconductor according to claim 1, wherein the calcination heat-treatment and the intermediate heat-treatment are constituted by heating and cooling processes respectively, and said coating of the raw material solution and said calcination heat-treatment after coating are given two or more times, and said intermediate heat-treatment is given at least one time.

6. The process for producing thick-film tape-shaped RE-type (123) superconductor according to claim 1, wherein the calcination heat-treatment is constituted by heating and cooling processes, and said coating of the raw material solution and said calcination heat-treatment after coating are given two or more times, and said intermediate heat-treatment and said heat-treatment for producing the superconductor are constituted by continuous heating and cooling processes.

7. The process for producing thick-film tape-shaped RE-type (123) superconductor according to claim 1, wherein the raw material solution comprising an organic solvent solution of at least one member selected from the group consisting of trifluoroacetates, naphthenates, octylic acid salts, neodecanoic acid salts and isononanoic acid salts.

8. The process for producing thick-film tape-shaped RE-type (123) superconductor according to claim 1, wherein the RE-type (123) superconductor consists of $RE_{1+x}Ba_{2-x}Cu_3O_y$ type oxide superconductor, wherein RE is at least more than one element selected from the group consisting of Y, Nd, Sm, Gd, Eu, Yb, Pr and Ho.

* * * * *